United States Patent
Sato et al.

(10) Patent No.: US 9,153,648 B2
(45) Date of Patent: Oct. 6, 2015

(54) SEMICONDUCTOR STACKED BODY, METHOD FOR MANUFACTURING SAME, AND SEMICONDUCTOR ELEMENT

(75) Inventors: Shinkuro Sato, Tokyo (JP); Akito Kuramata, Tokyo (JP); Yoshikatsu Morishima, Tokyo (JP); Kazuyuki Iizuka, Tokyo (JP)

(73) Assignees: TAMURA CORPORATION, Tokyo (JP); KOHA CO, LTD., Tokyo (JP)

(*) Notice: Subject to any disclaimer, the term of this patent is extended or adjusted under 35 U.S.C. 154(b) by 0 days.

(21) Appl. No.: 14/110,417

(22) PCT Filed: Apr. 3, 2012

(86) PCT No.: PCT/JP2012/059090
§ 371 (c)(1),
(2), (4) Date: Oct. 28, 2013

(87) PCT Pub. No.: WO2012/137781
PCT Pub. Date: Oct. 11, 2012

(65) Prior Publication Data
US 2014/0048823 A1     Feb. 20, 2014

(30) Foreign Application Priority Data
Apr. 8, 2011   (JP) .................... 2011-086805

(51) Int. Cl.
*H01L 29/20*     (2006.01)
*H01L 29/267*    (2006.01)
(Continued)

(52) U.S. Cl.
CPC ........ *H01L 29/2003* (2013.01); *C23C 16/0218* (2013.01); *C23C 16/0227* (2013.01);
(Continued)

(58) Field of Classification Search
CPC ............ H01L 29/267; H01L 21/02414; H01L 21/02433; H01L 29/2003; H01L 29/7371; H01L 29/7788; H01L 29/7789; H01L 29/7827; H01L 29/8122; H01L 29/8128; H01L 29/872; H01L 21/02458; H01L 21/0254; H01L 21/02576; H01L 21/0262; C30B 25/183
USPC ....................................... 257/43, 76; 438/104
See application file for complete search history.

(56) References Cited

U.S. PATENT DOCUMENTS

2001/0038656 A1*  11/2001  Takeuchi et al. ................ 372/45
2004/0007708 A1*   1/2004  Ichinose et al. ................ 257/79
(Continued)

FOREIGN PATENT DOCUMENTS

JP   2005-340308 A   12/2005
JP   2006-310765 A   11/2006
(Continued)

OTHER PUBLICATIONS

Japanese Office Action dated Nov. 20, 2013, with partial English translation.
(Continued)

*Primary Examiner* — Tucker Wright
(74) *Attorney, Agent, or Firm* — McGinn IP Law Group, PLLC

(57) ABSTRACT

A method for manufacturing a semiconductor stacked body, and a semiconductor element including the semiconductor stacked body includes a semiconductor stacked body, including a $Ga_2O_3$ substrate having, as a principal plane, a plane on which oxygen atoms are arranged in a hexagonal lattice, an AlN buffer layer formed on the $Ga_2O_3$ substrate, and a nitride semiconductor layer formed on the AlN buffer layer.

18 Claims, 6 Drawing Sheets

(51) Int. Cl.
*H01L 29/737* (2006.01)
*H01L 29/778* (2006.01)
*H01L 29/78* (2006.01)
*H01L 29/812* (2006.01)
*H01L 29/872* (2006.01)
*C23C 16/02* (2006.01)
*C23C 16/30* (2006.01)
*H01L 21/02* (2006.01)
*C30B 25/18* (2006.01)
*C30B 29/40* (2006.01)
*H01L 33/00* (2010.01)
*H01L 33/12* (2010.01)
*H01L 33/32* (2010.01)

(52) U.S. Cl.
CPC ........... *C23C16/0272* (2013.01); *C23C 16/303* (2013.01); *C30B 25/183* (2013.01); *C30B 29/403* (2013.01); *H01L 21/0254* (2013.01); *H01L 21/0262* (2013.01); *H01L 21/02414* (2013.01); *H01L 21/02433* (2013.01); *H01L 21/02458* (2013.01); *H01L 21/02576* (2013.01); *H01L 29/267* (2013.01); *H01L 29/7371* (2013.01); *H01L 29/7788* (2013.01); *H01L 29/7789* (2013.01); *H01L 29/7827* (2013.01); *H01L 29/8122* (2013.01); *H01L 29/8128* (2013.01); *H01L 29/872* (2013.01); *H01L 33/007* (2013.01); *H01L 33/12* (2013.01); *H01L 33/32* (2013.01)

(56) References Cited

U.S. PATENT DOCUMENTS

| | | | |
|---|---|---|---|
| 2006/0223287 A1* | 10/2006 | Ushida et al. | 438/483 |
| 2010/0133506 A1* | 6/2010 | Nakanishi et al. | 257/13 |
| 2010/0270548 A1 | 10/2010 | Ikemoto et al. | |
| 2011/0315998 A1 | 12/2011 | Hashimoto et al. | |

FOREIGN PATENT DOCUMENTS

| | | |
|---|---|---|
| JP | 2008-156141 A | 7/2008 |
| JP | 2010-183026 A | 8/2010 |

OTHER PUBLICATIONS

Edited by Isao Akazaki, "Group-III nitride semiconductor (Advanced Electronics I-21)", Japan, Baifukan, Dec. 8, 1999, p. 32 (with partial English translation.).
International Search Report dated Jun. 5, 2012 in PCT/JP2012/059090 (English version).
Chinese Office Action dated Aug. 4, 2015 with a partial English translation.

* cited by examiner

SEMICONDUCTOR STACKED BODY, METHOD FOR MANUFACTURING SAME, AND SEMICONDUCTOR ELEMENT

TECHNICAL FIELD

The invention relates to a semiconductor laminate (or stacked body), a method for manufacturing the semiconductor laminate and a semiconductor element.

BACKGROUND ART

Conventionally, a semiconductor element including a semiconductor laminate composed of a $Ga_2O_3$ substrate, an AlN buffer layer and a GaN layer is known (see, e.g., PTL 1). According to Patent Literature 1, the AlN buffer layer is formed to have a thickness of 10 to 30 nm by growing an AlN crystal on the $Ga_2O_3$ substrate. In addition, the GaN layer, which is formed by growing a GaN crystal on the AlN buffer layer, contains Si as a donor.

CITATION LIST

Patent Literature

[PTL 1] JP-A-2006-310765

SUMMARY OF INVENTION

Technical Problem

In a vertical-type element with vertical current flow such as the semiconductor element of PTL 1, it is important to reduce electrical resistivity of the semiconductor laminate in a thickness direction.

Therefore, it is an object of the invention to provide a semiconductor laminate having a small electrical resistivity in the thickness direction, a method of manufacturing the semiconductor laminate, and a semiconductor element equipped with the semiconductor laminate.

Solution to Problem

In order to achieve the above-mentioned object, the present invention provides a semiconductor laminate in [1] to [9], a semiconductor element in [10] and a process for producing the semiconductor laminate in [11] to [13].

[1] A semiconductor laminate comprises:
  a $Ga_2O_3$ substrate comprising a principal surface in which oxygen atoms are arranged in a hexagonal lattice pattern;
  an AlN buffer layer on the $Ga_2O_3$ substrate; and
  a nitride semiconductor layer on the buffer AlN layer.

[2] The semiconductor laminate according to [1], wherein the principal surface of the $Ga_2O_3$ substrate comprises any one of (101), (-201), (301) and (3-10) planes.

[3] The semiconductor laminate according to [2], wherein the principal surface of the $Ga_2O_3$ substrate comprises a (101) plane.

[4] The semiconductor laminate according to any one of [1] to [3], wherein the AlN buffer layer has a thickness of not less than 1 nm and not more than 5 nm.

[5] The semiconductor laminate according to [4], wherein the AlN buffer layer has a thickness of not less than 2 nm and not more than 3 nm.

[6] The semiconductor laminate according to [1], wherein the nitride semiconductor layer comprises a GaN layer.

[7] The semiconductor laminate according to [1], wherein a voltage drop in a thickness direction thereof is not more than 0.6V.

[8] The semiconductor laminate according to [1], wherein the nitride semiconductor layer comprises a high Si concentration region formed in a region on a side of the AlN buffer layer and having a Si concentration of not less than $5 \times 10^{18}$/$cm^3$.

[9] The semiconductor laminate according to [8], wherein the high Si concentration region has a thickness of not less than 2 nm.

[10] A semiconductor element comprises a semiconductor laminate comprising:
  a $Ga_2O_3$ substrate comprising a principal surface in which oxygen atoms are arranged in a hexagonal lattice pattern;
  an AlN buffer layer on the $Ga_2O_3$ substrate; and
  a nitride semiconductor layer on the AlN buffer layer,
  wherein an electric current is fed in a direction of a thickness of the semiconductor laminate.

[11] A method of manufacturing a semiconductor laminate comprises:
  a step of forming an AlN buffer layer by epitaxially growing an AlN crystal on a $Ga_2O_3$ substrate comprising a principal surface in which oxygen atoms are arranged in a hexagonal lattice pattern under a temperature condition of not more than 500° C.; and
  a step of forming a nitride semiconductor layer by growing a nitride semiconductor crystal on the AlN buffer layer.

[12] The method of manufacturing a semiconductor laminate according to [11], wherein the AlN buffer layer is adapted to have a thickness of not less than 1 nm and not more than 5 nm.

[13] The method of manufacturing a semiconductor laminate according to [11] or [12], wherein the nitride semiconductor crystal comprises a GaN crystal.

Advantageous Effects of Invention

According to the invention, it is possible to provide a semiconductor laminate having small electrical resistivity in the thickness direction, a method of manufacturing the semiconductor laminate, and a semiconductor element equipped with the semiconductor laminate.

DESCRIPTION OF EMBODIMENTS

In the present embodiments, it is possible to form a semiconductor laminate which is composed of a $Ga_2O_3$ substrate, an AlN buffer layer and a nitride semiconductor layer such as GaN layer and has a low electrical resistivity in a thickness direction. The inventors found that when the AlN buffer layer is formed by epitaxially growing an AlN crystal on a $Ga_2O_3$ substrate having a specific plane as a principal surface, it is possible to epitaxially grow a nitride semiconductor crystal such as GaN crystal having a mirror surface even if the AlN buffer layer is thin. It is possible to greatly reduce electrical resistivity of the semiconductor laminate in the thickness direction by reducing the thickness of AlN buffer layer.

In addition, in the present embodiments, use of a semiconductor laminate having a low electrical resistivity in the thickness direction allows a high-performance semiconductor element to be formed. Examples of the embodiments will be described in detail below.

First Embodiment

Figure 1A:
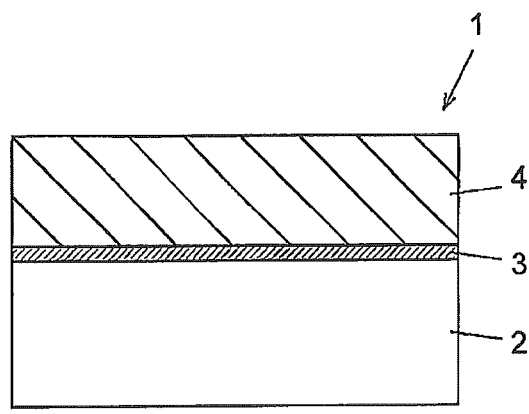
FIG. 1A is a cross sectional view showing a semiconductor laminate in a first embodiment.

FIG. 1A is a cross sectional view showing a semiconductor laminate in the first embodiment. A semiconductor laminate 1 includes a $Ga_2O_3$ substrate 2, an AlN buffer layer 3 and a nitride semiconductor layer 4.

The $Ga_2O_3$ substrate 2 is formed of a $\beta$-$Ga_2O_3$ single crystal. The $Ga_2O_3$ substrate 2 is a substrate of which principal surface is a plane with oxygen atoms arranged in a hexagonal lattice, i.e., any of (101), (-201), (301) and (3-10) planes. In this case, even if the AlN buffer layer 3 is thin (e.g., not more than 10 nm), a nitride semiconductor crystal having a flat surface can be grown on the AlN buffer layer 3 to form the nitride semiconductor layer 4. It is particularly preferable that the principal surface of the $Ga_2O_3$ substrate 2 be a (101) plane.

It should be noted that, when a thin AlN buffer layer is formed on a $Ga_2O_3$ substrate of which principal surface is a plane other than the above-mentioned planes, e.g., a (100) plane, a GaN crystal epitaxially grown on such an AlN buffer layer grows into a hexagonal hillock shape and a surface of the crystal does not become a mirror surface.

An AlN crystal is epitaxially grown on the $Ga_2O_3$ substrate 2 by a MOCVD (Metal Organic Chemical Vapor Deposition) method, etc., thereby forming the AlN buffer layer 3. A growth temperature of the AlN crystal is 350 to 600° C., particularly preferably 380 to 500° C.

The thickness of the AlN buffer layer 3 is 1 to 5 nm (not less than 1 nm and not more than 5 nm), more preferably, 2 to 3 nm. When the thickness is less than 1 nm, a nitride semiconductor crystal such as GaN crystal constituting the nitride semiconductor layer 4 grows into a hexagonal hillock shape and a surface thereof does not become a mirror surface. Meanwhile, when the thickness is more than 5 nm, electrical resistivity of the semiconductor laminate 1 in the thickness direction is high. When the thickness is 2 to 3 nm, the electrical resistivity of the semiconductor laminate 1 in the thickness direction is low and it is also relatively easy to obtain a mirror surface on the nitride semiconductor crystal which grows on the AlN buffer layer 3.

In addition, the thinner the AlN buffer layer 3, the more improved the crystal quality of the nitride semiconductor layer 4. When the thickness of the AlN buffer layer 3 is, e.g., 1 to 5 nm, it is possible to form the nitride semiconductor layer 4 having enough crystal quality.

A nitride semiconductor crystal such as GaN crystal is epitaxially grown on the AlN buffer layer 3 by the MOCVD method, etc., while adding a conductive impurity such as Si, thereby forming the nitride semiconductor layer 4. When the GaN crystal is used as the nitride semiconductor crystal, the growth temperature thereof is, e.g., 800 to 1100° C. The thickness of the nitride semiconductor layer 4 is, e.g., 2 μm. A Si concentration of the nitride semiconductor layer 4 is, e.g., $2 \times 10^{18}/cm^3$.

Figure 1B:
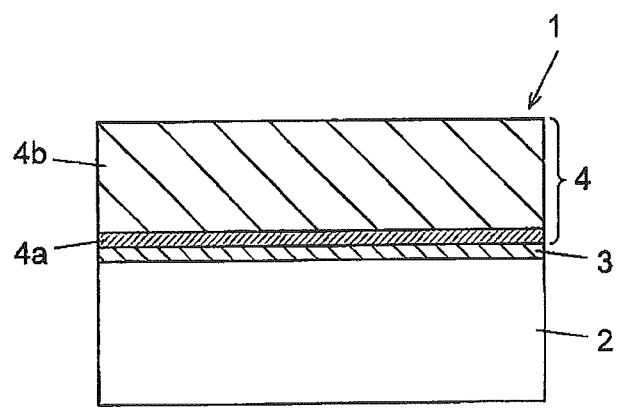
FIG. 1B is a cross sectional view showing a semiconductor laminate in the first embodiment.

In addition, as shown in FIG. 1B, the nitride semiconductor layer 4 of the semiconductor laminate 1 may include a high Si concentration region 4a in the vicinity of a surface on the AlN buffer layer 3 side. It is possible to further reduce electrical resistivity of the semiconductor laminate 1 in the thickness direction by forming the high Si concentration region 4a in the nitride semiconductor layer 4.

The high Si concentration region 4a is formed by adding a higher amount of Si at the initial stage of the growth of the nitride semiconductor crystal on the AlN buffer layer 3.

The Si concentration of the high Si concentration region 4a is higher than that of remaining region 4b. The Si concentration of the high Si concentration region 4a is not less than $5 \times 10^{18}/cm^3$, particularly preferably not less than $1 \times 10^{19}/cm^3$.

In addition, the thickness of the high Si concentration region 4a is preferably not less than 2 nm in order to further reduce the electrical resistivity of the semiconductor laminate 1 in the thickness direction.

Second Embodiment

A vertical FET (Field effect transistor) including the semiconductor laminate 1 of the first embodiment will be described as the second embodiment.

Figure 2:
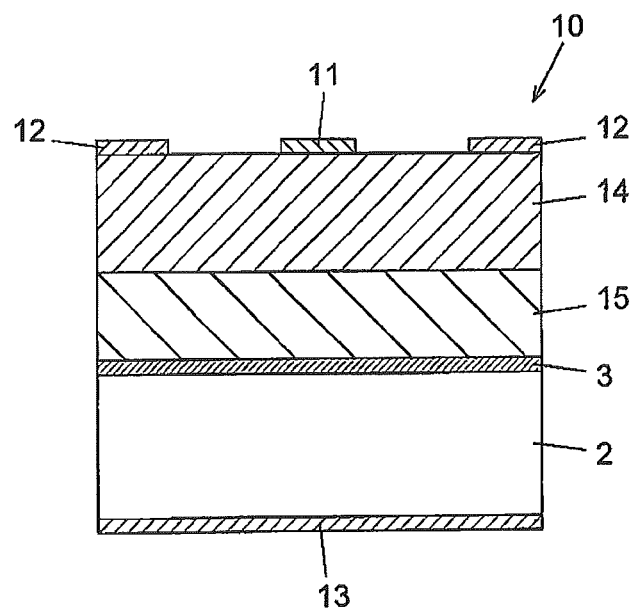
FIG. 2 is a cross sectional view showing a vertical FET in a second embodiment.

FIG. 2 is a cross sectional view showing a vertical FET which is a semiconductor element according to the second embodiment. A vertical FET 10 includes the semiconductor laminate 1 in which the $Ga_2O_3$ substrate 2, the AlN buffer layer 3 and an $n^+$-GaN layer 15 as a nitride semiconductor layer are included, a GaN-based vertical FET 14 formed on a surface (upper surface in FIG. 2) of the $n^+$-GaN layer 15, a gate electrode 11 and a source electrode 12 which are formed on the GaN-based vertical FET 14, and a drain electrode 13 formed on a surface (lower surface in FIG. 2) of the $Ga_2O_3$ substrate 2.

It should be noted that, the vertical FET 10 is an example of a vertical FET which can be formed using the semiconductor laminate 1.

Third Embodiment

A vertical FET including the semiconductor laminate 1 of the first embodiment and having a MIS (Metal Insulator Semiconductor) gate structure will be described as the third embodiment.

Figure 3:
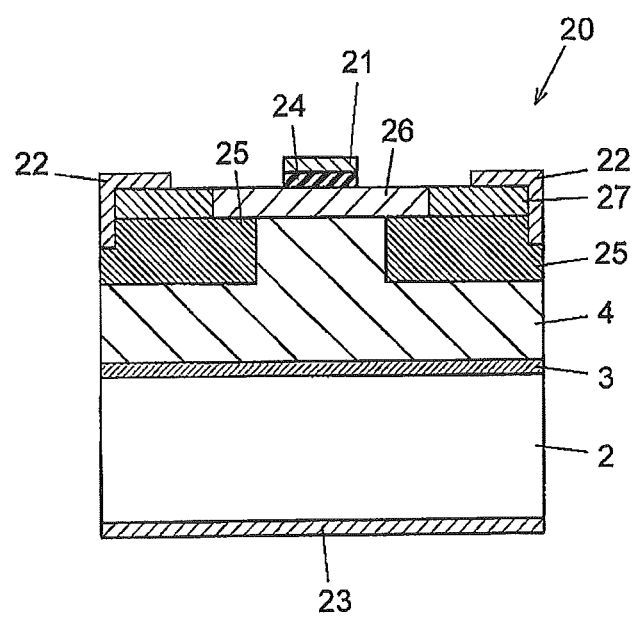
FIG. 3 is a cross sectional view showing a vertical FET in a third embodiment.

FIG. 3 is a cross sectional view showing a vertical FET which is a semiconductor element according to the third embodiment. A vertical FET 20 includes the semiconductor laminate 1 in which the $Ga_2O_3$ substrate 2, the AlN buffer layer 3 and the nitride semiconductor layer 4 are included, a $P^+$ region 25 formed by introducing a p-type impurity into the nitride semiconductor layer 4, an $Al_{0.2}Ga_{0.8}N$ layer 26 formed on a surface (upper surface in FIG. 3) of the nitride semiconductor layer 4, an $n^+$ region 27 formed by introducing an n-type impurity such as Si into the $Al_{0.2}Ga_{0.8}N$ layer 26, a gate electrode 21 formed on the $Al_{0.2}Ga_{0.8}N$ layer 26 via a gate insulator film 24, a source electrode 22 connected to the $n^+$ region 27 as well as to the $P^+$ region 25, and a drain electrode 23 formed on a surface (lower surface in FIG. 3) of the $Ga_2O_3$ substrate 2.

Here, the nitride semiconductor layer 4 has, e.g., a thickness of 6 μm and a Si concentration of $1\times10^{18}/cm^3$. Meanwhile, the $P^+$ region 25 has, e.g., a thickness of 1 μm and a p-type impurity concentration of $1\times10^{18}/cm^3$. The $Al_{0.2}Ga_{0.8}N$ layer 26 does not contain impurities. The source electrode 22 and the drain electrode 23 are laminates of, e.g., Ti film and Al film. The gate electrode 21 and the gate insulator film 24 are respectively formed of, e.g., Al and $SiO_2$.

It should be noted that, the vertical FET 20 is an example of a vertical FET having a MIS gate structure which can be formed using the semiconductor laminate 1.

Fourth Embodiment

A vertical FET including the semiconductor laminate 1 of the first embodiment and having a Schottky gate structure will be described as the fourth embodiment.

Figure 4:
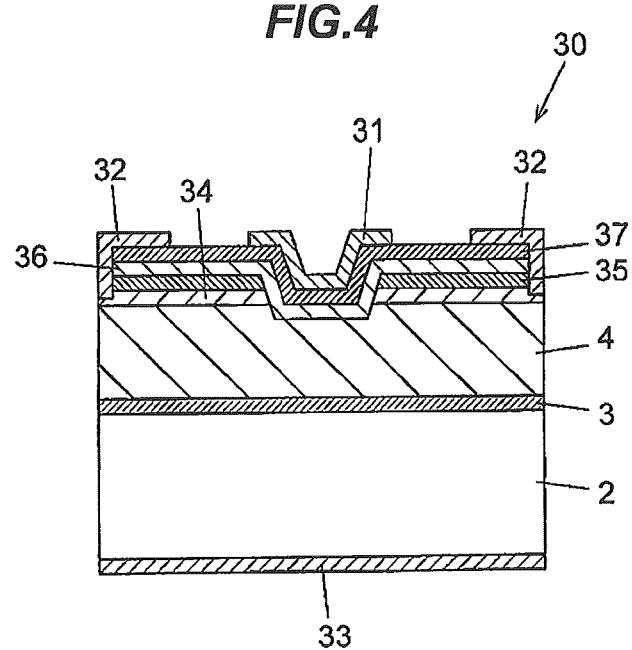
FIG. 4 is a cross sectional view showing a vertical FET in a fourth embodiment.

FIG. 4 is a cross sectional view showing a vertical FET which is a semiconductor element according to the fourth embodiment. A vertical FET 30 includes the semiconductor laminate 1 in which the $Ga_2O_3$ substrate 2, the AlN buffer layer 3 and the nitride semiconductor layer 4 are included, a $P^+$-GaN layer 34, an $n^+$-GaN layer 35, a GaN layer 36 and an $Al_{0.2}Ga_{0.8}N$ layer 37 which are sequentially laminated on a surface (upper surface in FIG. 4) of the nitride semiconductor layer 4, a gate electrode 31 formed on the $Al_{0.2}Ga_{0.8}N$ layer 37, a source electrode 32 connected to the $P^+$-GaN layer 34, to the $n^+$-GaN layer 35, to the GaN layer 36 and to the $Al_{0.2}Ga_{0.8}N$ layer 37, and a drain electrode 33 formed on a surface (lower surface in FIG. 4) of the $Ga_2O_3$ substrate 2.

Here, the nitride semiconductor layer 4 has, e.g., a thickness of 6 μm and a Si concentration of $1\times10^{16}/cm^3$. Meanwhile, the $P^+$-GaN layer 34 has, e.g., a thickness of 1 μm and a p-type impurity concentration of $1\times10^{18}/cm^3$. In addition, the $n^+$-GaN layer 35 has, e.g., a thickness of 200 nm and an n-type impurity concentration of $1\times10^{18}/cm^3$. The GaN layer 36 does not contain impurities and has a thickness of, e.g., 100 nm. The $Al_{0.2}Ga_{0.8}N$ layer 37 does not contain impurities and has a thickness of, e.g., 30 nm. The source electrode 32 and the drain electrode 33 are laminates of, e.g., Ti film and Al film. The gate electrode 31 is a laminate of, e.g., Ni film and Au film It should be noted that, the vertical FET 30 is an example of a vertical FET having a Schottky gate structure which can be formed using the semiconductor laminate 1.

Fifth Embodiment

Another vertical FET including the semiconductor laminate 1 of the first embodiment and having a Schottky gate structure will be described as the fifth embodiment.

Figure 5:
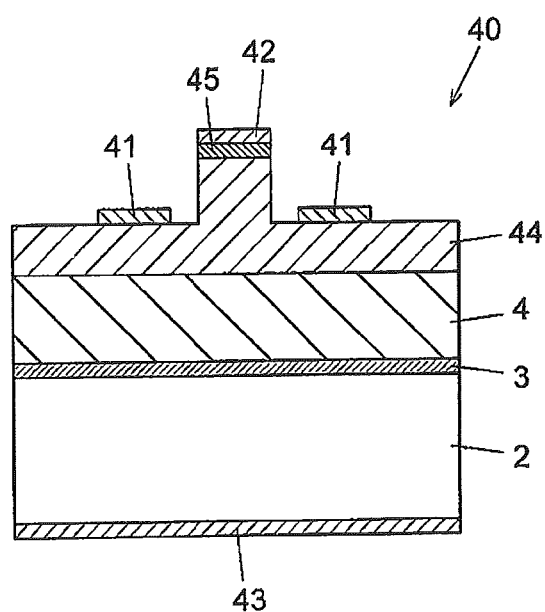
FIG. 5 is a cross sectional view showing a vertical FET in a fifth embodiment.

FIG. 5 is a cross sectional view showing a vertical FET which is a semiconductor element according to the fifth embodiment. A vertical FET 40 includes the semiconductor laminate 1 in which the $Ga_2O_3$ substrate 2, the MN buffer layer 3 and the nitride semiconductor layer 4 are included, an $n^-$-GaN layer 44 formed on a surface (upper surface in FIG. 5) of the nitride semiconductor layer 4, a gate electrode 41 formed on a flat portion of the $n^-$-GaN layer 44, a source electrode 42 formed on a raised portion of the $n^-$-GaN layer 44 via an $n^+$-InAlGaN contact layer 45, and a drain electrode 43 formed on a surface (lower surface in FIG. 5) of the $Ga_2O_3$ substrate 2.

Here, the nitride semiconductor layer 4 has, e.g., a thickness of 6 μm and a Si concentration of $1\times10^{18}/cm^3$. Meanwhile, the flat portion of the $n^-$-GaN layer 44 has, e.g., a thickness of 3 μm and an n-type impurity concentration of $1\times10^{16}/cm^3$. The source electrode 42 is formed of, e.g., WSi. The drain electrode 43 is a laminate of, e.g., Ti film and Al film. The gate electrode 41 is formed of, e.g., PdSi.

It should be noted that, the vertical FET 40 is an example of a vertical FET having a Schottky gate structure which can be formed using the semiconductor laminate 1.

Sixth Embodiment

A heterojunction bipolar transistor (HBT) including the semiconductor laminate 1 of the first embodiment will be described as the sixth embodiment.

Figure 6:
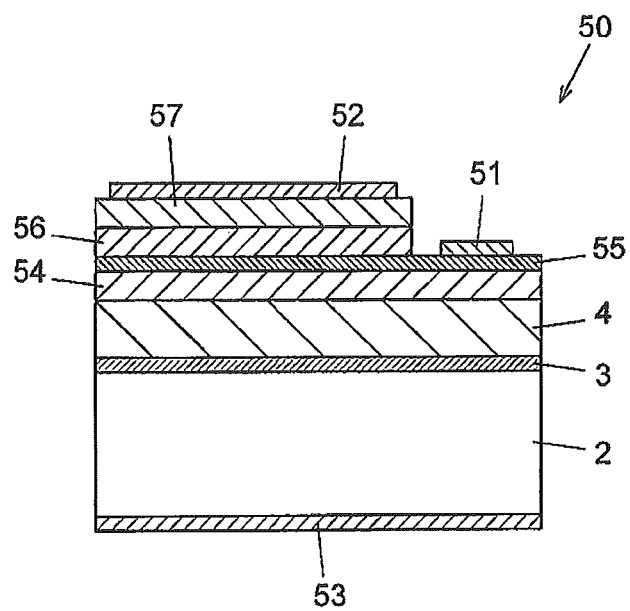
FIG. 6 is a cross sectional view showing a HBT in a sixth embodiment.

FIG. 6 is a cross sectional view showing a HBT which is a semiconductor element according to the sixth embodiment. A HBT 50 includes the semiconductor laminate 1 in which the $Ga_2O_3$ substrate 2, the AlN buffer layer 3 and the nitride semiconductor layer 4 are included, an $n^-$-GaN layer 54 and a $p^+$-GaN layer 55 which are laminated on a surface (upper surface in FIG. 6) of the nitride semiconductor layer 4, an $n^+$-$Al_{0.1}Ga_{0.9}N$ layer 56 and an $n^+$-GaN layer 57 which are laminated on the $p^+$-GaN layer 55, a base electrode 51 formed on the $p^+$-GaN layer 55, an emitter electrode 52 formed on the $n^+$-GaN layer 57, and a collector electrode 53 formed on a surface (lower surface in FIG. 6) of the $Ga_2O_3$ substrate 2.

Here, the nitride semiconductor layer 4 has, e.g., a thickness of 4 μm and a Si concentration of $1\times10^{18}/cm^3$. Meanwhile, the $n^-$-GaN layer 54 has, e.g., a thickness of 2 μm and an n-type impurity concentration of $1\times10^{16}/cm^3$. In addition, the $p^+$-GaN layer 55 has, e.g., a thickness of 100 nm and a p-type impurity concentration of $1\times10^{18}/cm^3$. Then, the $n^+$-$Al_{0.1}Ga_{0.9}N$ layer 56 has, e.g., a thickness of 500 nm and an n-type impurity concentration of $1\times10^{18}/cm^3$. In addition, the $n^+$-GaN layer 57 has, e.g., a thickness of 1 μm and an n-type impurity concentration of $1\times10^{18}/cm^3$. The emitter electrode 52 is a laminate of, e.g., Ti film and Al film. The collector electrode 53 is a laminate of, e.g., Ti film and Au film. The base electrode 51 is a laminate of, e.g., Ni film and Au film.

It should be noted that, the HBT 50 is an example of a heterojunction bipolar transistor which can be formed using the semiconductor laminate 1.

Seventh Embodiment

A Schottky-barrier diode (SBD) including the semiconductor laminate 1 of the first embodiment will be described as the seventh embodiment.

Figure 7:
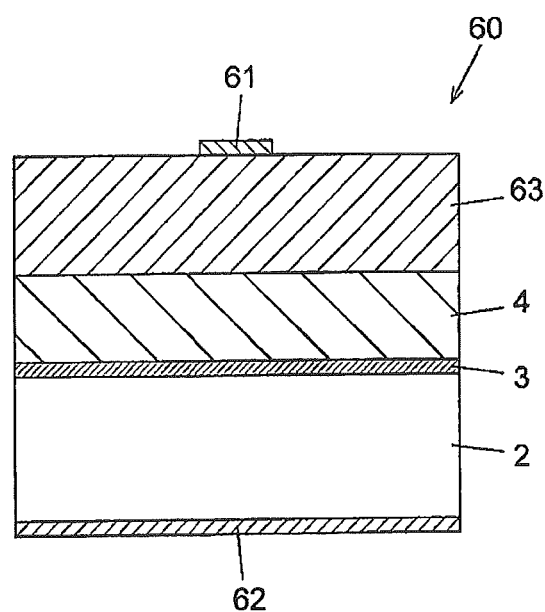
FIG. 7 is a cross sectional view showing a SBD in a seventh embodiment.

FIG. 7 is a cross sectional view showing a SBD which is a semiconductor element according to the seventh embodiment. A SBD 60 includes the semiconductor laminate 1 in which the $Ga_2O_3$ substrate 2, the AlN buffer layer 3 and the nitride semiconductor layer 4 are included, an $n^-$-GaN layer 63 formed on a surface (upper surface in FIG. 7) of the nitride semiconductor layer 4, an anode electrode 61 formed on the $n^-$-GaN layer 63, and a cathode electrode 62 formed on a surface (lower surface in FIG. 7) of the $Ga_2O_3$ substrate 2.

Here, the nitride semiconductor layer 4 has, e.g., a thickness of 6 μm and a Si concentration of $1\times10^{18}/cm^3$. Meanwhile, the $n^-$-GaN layer 63 has, e.g., a thickness of 7 μm and an n-type impurity concentration of $1\times10^{16}/cm^3$. The anode electrode 61 is formed of, e.g., Au. The cathode electrode 62 is a laminate of, e.g., Ti film and Al film.

It should be noted that the SBD 60 is an example of a Schottky-barrier diode which can be formed using the semiconductor laminate 1.

Eighth Embodiment

A light-emitting diode (LED) including the semiconductor laminate 1 of the first embodiment will be described as the eighth embodiment.

Figure 8:
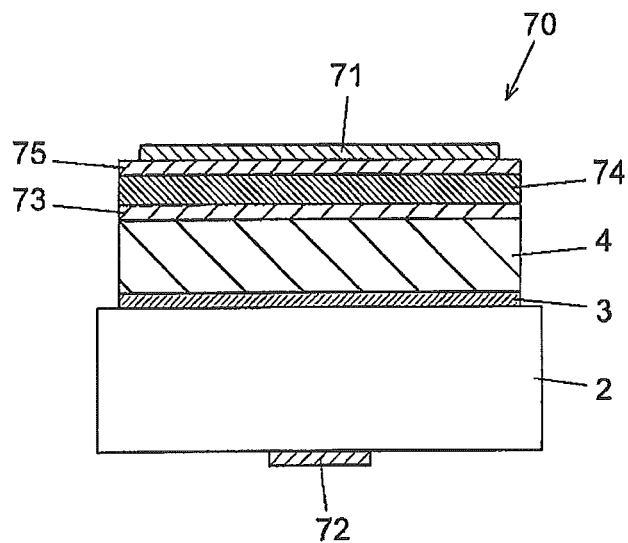
FIG. 8 is a cross sectional view showing an LED in an eighth embodiment.

FIG. 8 is a cross sectional view showing an LED which is a semiconductor element according to the eighth embodiment. An LED 70 includes the semiconductor laminate 1 in which the $Ga_2O_3$ substrate 2, the AlN buffer layer 3 and the nitride semiconductor layer 4 are included, an emission layer 73, a p-type cladding layer 74 and a p-type contact layer 75 which are laminated on a surface (upper surface in FIG. 8) of the nitride semiconductor layer 4, a p-electrode 71 formed on the p-type contact layer 75, and an n-electrode 72 formed on a surface (lower surface in FIG. 8) of the $Ga_2O_3$ substrate 2.

Here, the nitride semiconductor layer 4 has, e.g., a thickness of 5 μm and a Si concentration of $1\times10^{18}/cm^3$. The nitride semiconductor layer 4 functions as an n-type cladding layer. Meanwhile, the emission layer 73 includes, e.g., three pairs of multiple quantum well structures each composed of an 8 nm-thick GaN crystal and a 2 nm-thick InGaN crystal. Then, the p-type cladding layer 74 is, e.g., formed of a GaN crystal with a Mg concentration of $5.0\times10^{19}/cm^3$ and has a thickness of 150 nm. In addition, the p-type contact layer 75 is, e.g., formed of a GaN crystal with a Mg concentration of $1.5\times10^{20}/cm^3$ and has a thickness of 10 nm.

It should be noted that the LED 70 is an example of a light-emitting diode which can be formed using the semiconductor laminate 1.

Effects of Embodiments

In the first embodiment, the AlN buffer layer 3 is formed by epitaxially growing an AlN crystal on the $Ga_2O_3$ substrate 2 of which principal surface is a plane with oxygen atoms arranged in a hexagonal lattice, i.e., any of (101), (−201), (301) and (3-10) planes. Therefore, even when the AlN buffer layer 3 is thin, it is possible to epitaxially grow a nitride semiconductor crystal such as GaN crystal having a mirror surface, thereby forming the nitride semiconductor layer 4 having a mirror surface. It is possible to greatly reduce electrical resistivity of the semiconductor laminate 1 in the thickness direction by reducing the thickness of the AlN buffer layer 3.

In addition, the high Si concentration region 4a having a Si concentration of not less than $5\times10^{18}/cm^3$ is formed in the nitride semiconductor layer 4 and this allows the electrical resistivity of the semiconductor laminate 1 in the thickness direction to be further reduced. It is considered that this is because electrons tunnel through potential barrier at a heterointerface by forming the high Si concentration region 4a having a high concentration of Si and this allows an electric current to pass through easily.

In addition, the high Si concentration region 4a with a thickness of not less than 2 nm allows the electrical resistivity of the semiconductor laminate in the thickness direction to be further reduced.

In addition, according to the second to eighth embodiments, it is possible to obtain a high-performance vertical semiconductor element by forming a vertical semiconductor element which includes the semiconductor laminate 1 and in which a current passes in a thickness direction of the semiconductor laminate 1.

The semiconductor laminate 1 in the present embodiments was evaluated as shown in the following Examples 1 and 2.

Example 1

In Example 1, plural semiconductor stacked bodies 1 having AlN buffer layers 3 with different thicknesses in a range of 0.5 to 32 nm were formed to examine a relation between a thickness of the AlN buffer layer 3 and the electrical resistivity of the semiconductor laminate 1 in the thickness direction. Each semiconductor laminate 1 was formed by the following process.

Firstly, the $Ga_2O_3$ substrate 2 having a (101) plane as a principal surface was cleaned with organic solvent and acid and was subsequently placed in a MOCVD apparatus. Next, nitriding of a surface thereof was carried out in an ammonia ($NH_3$) atmosphere diluted with nitrogen at a substrate temperature of 550° C.

After that, an AlN crystal was grown by flowing TMA (trimethylaluminum) and $NH_3$ into a furnace at a substrate temperature of 450° C., thereby forming the AlN buffer layer 3 which is a low-temperature AlN buffer layer.

After raising the substrate temperature to 1050° C., the furnace atmosphere was changed to hydrogen, and then, TMG (trimethylgallium), $NH_3$ and monosilane ($MtSiH_3$) were flown into the furnace to grow a GaN crystal having a Si concentration of $2.0\times10^{18}/cm^3$, thereby forming the nitride semiconductor layer 4 having a thickness of 2 μm.

After that, electrodes were formed respectively on surfaces of the $Ga_2O_3$ substrate 2 and the nitride semiconductor layer 4 made through the above-mentioned process. Then, voltage was applied between the electrodes and voltage drop at a current density of 220 A/cm$^2$ was measured.

Figure 9:
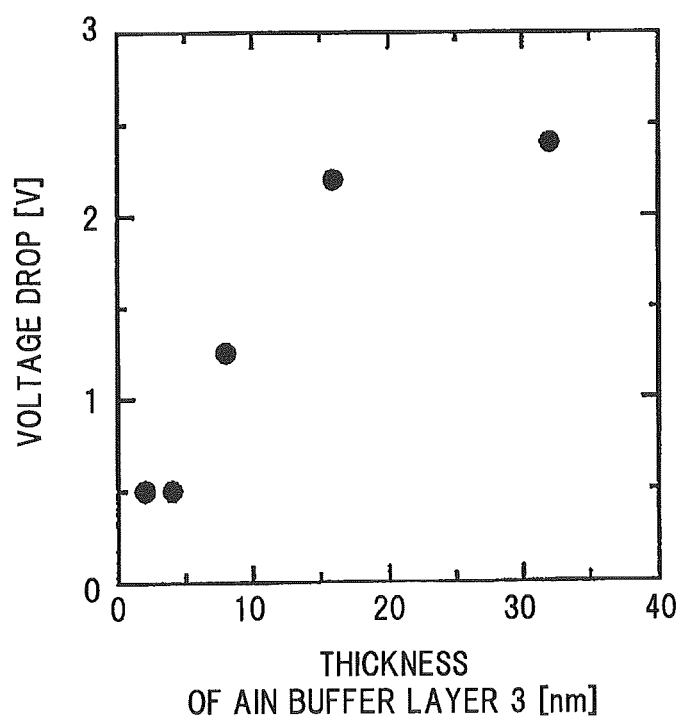
FIG. 9 is a graph showing a relation between a thickness of an AlN buffer layer and voltage drop in Example.

FIG. 9 is a graph showing a relation between a thickness of the AlN buffer layer and voltage drop at a current density of 220 A/cm$^2$. As shown FIG. 9, the smaller the thickness of the AlN buffer layer 3, the smaller the voltage drop, i.e., the lower the electrical resistivity of the semiconductor laminate 1 in the thickness direction. The voltage drop is as very small as 0.5V especially when the thickness of the AlN buffer layer 3 is not more than 4 nm. A high-performance semiconductor element can be manufactured using the semiconductor laminate 1 when the voltage drop is, e.g., not more than 0.6V.

In addition, crystal quality of the nitride semiconductor layer 4 formed of a GaN crystal which is made through the above-mentioned process was evaluated using an X-ray diffractometer. Measurement was conducted on (002) and (101) planes of the GaN crystal constituting the nitride semiconductor layer 4.

Figure 10:
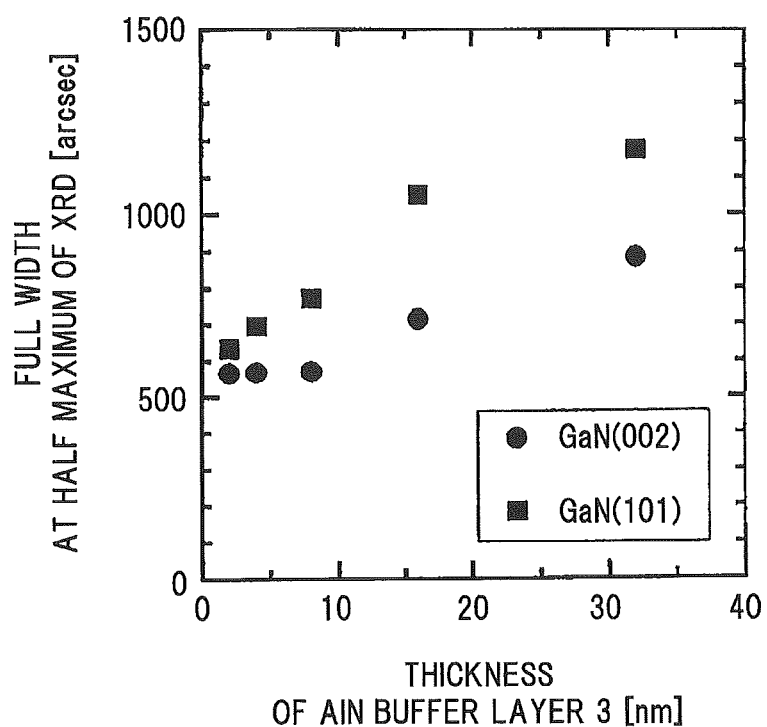
FIG. 10 is a graph showing a relation between a thickness of an AlN buffer layer and an X-ray diffraction rocking curve full width at half maximum in Example.

FIG. 10 is a graph showing a relation between a thickness of an AlN buffer layer and an X-ray diffraction rocking curve full width at half maximum. In FIG. 10, the measurement results of both the (002) and (101) planes show that the thinner the AlN buffer layer 3, the smaller the full width at half maximum and the higher the crystal quality.

Example 2

In Example 2, the LED 70 in the eighth embodiment was formed and forward voltage drop $V_F$ was measure.

Firstly, a Si-doped n-type β-$Ga_2O_3$ substrate was prepared as the $Ga_2O_3$ substrate 2. Here, the β-$Ga_2O_3$ substrate has a thickness of 400 μm and a principal surface of (101) plane.

Next, 2 nm of AlN crystal was grown on the β-Ga$_2$O$_3$ substrate using a MOCVD apparatus at a growth temperature of 450° C., thereby forming the AlN buffer layer 3. Next, the nitride semiconductor layer 4 as an n-type cladding layer was formed by growing 5 μm of GaN crystal having a Si concentration of $1.0 \times 10^{18}$/cm$^3$.

Next, three pairs of multiple quantum well structures each composed of an 8 nm-thick GaN crystal and a 2 nm-thick InGaN crystal were formed at a growth temperature of 750° C. and 10 nm of GaN crystal was further grown, thereby forming the emission layer 73.

Next, 150 nm of GaN crystal having a Mg concentration of $5.0 \times 10^{19}$/cm$^3$ was grown at a growth temperature of 1000° C., thereby forming the p-type cladding layer 74. Next, 10 nm of GaN crystal having a Mg concentration of $1.5 \times 10^{20}$/cm$^3$ was grown at a growth temperature of 1000° C., thereby forming the p-type contact layer 75.

In the above process, TMG (trimethylgallium) was used as a Ga source, TMI (trimethylindium) as an In source, SiH$_3$CH$_3$ (monomethylsilane) gas as a Si source, Cp$_2$Mg (cyclopentadienylmagnesium) as a Mg source and NH$_3$ (ammonia) gas as an N source.

A surface of the LED epitaxial wafer obtained as described above was etched from the p-type contact layer 75 side to a position deeper than the emission layer 73 using an ICP-RIE system to shape into a mesa shape. Next, a SiO$_2$ film was formed on a side surface of the emission layer 73 using a sputtering apparatus. On the p-type contact layer 75 and the Ga$_2$O$_3$ substrate 2, electrodes respectively in ohmic-contact therewith were further formed using a deposition apparatus, thereby obtaining the LED 70 in which a light extraction surface is located on the Ga$_2$O$_3$ substrate 2 side.

Meanwhile, an LED which has a 20 nm-thick AlN buffer layer 3 was formed as Comparative Example.

After that, the LED 70 and the LED of Comparative Example were respectively mounted on a can-type stem using Ag paste, and the voltage drop V$_F$ at a current I$_F$ of 20 mA was measured. As a result, the voltage drop V$_F$ of the LED 70 was 3.12V while that of the conventional LED in Comparative Example was 4.32V, and it was confirmed that the voltage drop V$_F$ of the LED 70 is at a level allowing its practical use as a light-emitting element.

Although the embodiments and examples of the invention have been described above, the invention according to claims is not to be limited to the above-described embodiments and examples. Further, please note that all combinations of the features described in the embodiments and examples are not necessary to solve the problem of the invention.

REFERENCE SIGNS LIST

1 Semiconductor laminate
2 Ga$_2$O$_3$ substrate
3 AlN buffer layer
4 Nitride semiconductor layer
4a High Si concentration region
4b Region
10, 20, 30, 40 Vertical FET
50 HBT
60 SBT
70 LED

The invention claimed is:

1. A semiconductor laminate, comprising:
a Ga$_2$O$_3$ substrate comprising a principal surface in which oxygen atoms are arranged in a hexagonal lattice pattern;
an AlN buffer layer on the Ga$_2$O$_3$ substrate; and
a nitride semiconductor layer on the AlN buffer layer,
wherein the AlN buffer layer has a thickness of not less than 1 nm and not more than 5 nm and is formed under a temperature condition of not more than 500° C. by epitaxially growing an AlN crystal on the Ga$_2$O$_3$ substrate.

2. The semiconductor laminate according to claim 1, wherein the principal surface of the Ga$_2$O$_3$ substrate comprises any one of (101), (−201), (301) and (3-10) planes.

3. The semiconductor laminate according to claim 2, wherein the principal surface of the Ga$_2$O$_3$ substrate comprises a (101) plane.

4. The semiconductor laminate according to claim 1, wherein the AlN buffer layer has a thickness of not less than 2 nm and not more than 3 nm.

5. The semiconductor laminate according to claim 1, wherein the nitride semiconductor layer comprises a GaN layer.

6. The semiconductor laminate according to claim 1, wherein a voltage drop in a thickness direction thereof is not more than 0.6V.

7. The semiconductor laminate according to claim 1, wherein the nitride semiconductor layer comprises a high Si concentration region formed in a region on a side of the AlN buffer layer and having a Si concentration of not less than $5 \times 10^{18}$/cm$^3$.

8. The semiconductor laminate according to claim 7, wherein the high Si concentration region has a thickness of not less than 2 nm.

9. The semiconductor laminate according to claim 1, wherein the principal surface of the Ga$_2$O$_3$ substrate comprises one of (−201), (301), and (3-10) planes.

10. The semiconductor laminate according to claim 1, wherein the principal surface of the Ga$_2$O$_3$ substrate comprises any of (−201), (301), and (3-10) planes.

11. The semiconductor laminate according to claim 1, wherein the AlN buffer layer is formed by the epitaxially growing of the AlN crystal on the Ga$_2$O$_3$ substrate comprising a principal surface in which oxygen atoms are arranged in the hexagonal lattice pattern under the temperature condition of not more than 500° C.

12. A semiconductor element, comprising a semiconductor laminate comprising:
a Ga$_2$O$_3$ substrate comprising a principal surface in which oxygen atoms are arranged in a hexagonal lattice pattern;
an AlN buffer layer on the Ga$_2$O$_3$ substrate; and
a nitride semiconductor layer on the AlN buffer layer,
wherein an electric current is fed in a direction of a thickness of the semiconductor laminate, and
wherein the AlN buffer layer has a thickness of not less than 1 nm and not more than 5 nm and is formed under a temperature condition of not more than 500° C. by epitaxially growing an AlN crystal on the Ga$_2$O$_3$ substrate.

13. The semiconductor element according to claim 12, wherein the principal surface of the Ga$_2$O$_3$ substrate comprises any one of (101), (−201), (301) and (3-10) planes.

14. The semiconductor element according to claim 12, wherein the principal surface of the Ga$_2$O$_3$ substrate comprises one of (−201), (301), and (3-10) planes.

15. The semiconductor element according to claim 12, wherein the principal surface of the Ga$_2$O$_3$ substrate comprises any of (−201), (301), and (3-10) planes.

16. The semiconductor element according to claim 12, wherein the AlN buffer layer is formed by the epitaxially growing of the AlN crystal on the Ga$_2$O$_3$ substrate comprising a principal surface in which oxygen atoms are arranged in the hexagonal lattice pattern under the temperature condition of not more than 500° C.

17. A method of manufacturing a semiconductor laminate, the method comprising:
  forming an AlN buffer layer by epitaxially growing an AlN crystal on a $Ga_2O_3$ substrate comprising a principal surface in which oxygen atoms are arranged in a hexagonal lattice pattern under a temperature condition of not more than 500° C.; and
  forming a nitride semiconductor layer by growing a nitride semiconductor crystal on the AlN buffer layer,
  wherein the AlN buffer layer is adapted to have a thickness of not less than 1 nm and not more than 5 nm.

18. The method of manufacturing a semiconductor laminate according to claim 17, wherein the nitride semiconductor crystal comprises a GaN crystal.

* * * * *